United States Patent
Lee et al.

(10) Patent No.: US 7,468,103 B2
(45) Date of Patent: Dec. 23, 2008

(54) METHOD OF MANUFACTURING GALLIUM NITRIDE-BASED SINGLE CRYSTAL SUBSTRATE

(75) Inventors: Soo Min Lee, Seoul (KR); Hun Joo Hahm, Kyungki-do (KR); Young Ho Park, Kyungki-do (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 480 days.

(21) Appl. No.: 10/837,709

(22) Filed: May 4, 2004

(65) Prior Publication Data

US 2005/0072353 A1    Apr. 7, 2005

(30) Foreign Application Priority Data

Oct. 7, 2003    (KR) ............... 10-2003-0069495

(51) Int. Cl.
   *C30B 25/18*    (2006.01)
(52) U.S. Cl. ............... 117/97; 117/1; 117/90; 117/88; 117/915
(58) Field of Classification Search ............ 117/97, 117/1, 90, 84, 88, 915
   See application file for complete search history.

(56) References Cited

U.S. PATENT DOCUMENTS

| | | | |
|---|---|---|---|
| 5,679,152 A * | 10/1997 | Tischler et al. ............... | 117/97 |
| 6,139,628 A * | 10/2000 | Yuri et al. ............... | 117/89 |
| 6,620,641 B2 * | 9/2003 | Yamaguchi et al. ............ | 438/22 |
| 6,875,272 B2 | 4/2005 | Kainosho et al. | |
| 6,972,051 B2 * | 12/2005 | Tischler et al. ............... | 117/97 |
| 2003/0146433 A1 * | 8/2003 | Cantwell et al. ............... | 257/43 |
| 2004/0137732 A1 * | 7/2004 | Frayssinet et al. ........... | 438/689 |

FOREIGN PATENT DOCUMENTS

| | | |
|---|---|---|
| JP | 11-330610 A | 11/1999 |
| JP | 2002-261026 | 9/2002 |
| JP | 2006-261026 A | 9/2002 |
| JP | 2002-293697 A | 10/2002 |
| JP | 2003-7619 A | 1/2003 |
| WO | WO 03/000964 | 1/2003 |

OTHER PUBLICATIONS

Japanese Patent Office, Office Action mailed Feb. 13, 2007 and English Translation.

* cited by examiner

*Primary Examiner*—Robert M Kunemund
(74) *Attorney, Agent, or Firm*—Lowe Hauptman Ham & Berner

(57) ABSTRACT

Disclosed herein is a method of manufacturing a gallium nitride-based ($Al_xIn_yGa_{(1-x-y)}N$, where $0 \leq x \leq 1$, $0 \leq y \leq 1$, $0 \leq x+y \leq 1$) single crystal substrate. The method comprises the steps of preparing a ZnO substrate, primarily growing a gallium nitride-based single crystal layer, and secondarily growing an additional gallium nitride-based single crystal layer on the primarily grown gallium nitride-based single crystal layer while removing the ZnO substrate by etching the underside of the ZnO substrate.

8 Claims, 3 Drawing Sheets

Laser beam

1

METHOD OF MANUFACTURING GALLIUM NITRIDE-BASED SINGLE CRYSTAL SUBSTRATE

BACKGROUND OF THE INVENTION

1. Field of the Invention

The present invention relates to a method of manufacturing a gallium nitride-based ($Al_x In_y Ga_{(1-x-y)} N$, where $0 \leq x \leq 1$, $0 \leq y \leq 1$, $0 \leq x+y \leq 1$) single crystal substrate, and more particularly to a method of manufacturing a gallium nitride (GaN) single crystal substrate using a ZnO substrate.

2. Description of the Related Art

Recently, as a higher density and a higher resolution in recording/reproduction are increasingly required in the field of an optical disk, investigations have been actively undertaken on a semiconductor device capable of emitting light in a short wavelength range. As a material for the semiconductor device capable of emitting light in the short wavelength range, a gallium nitride single crystal substrate has been widely used. Since the gallium nitride single crystal has the energy band gap of 3.39 eV, the material is adequate for emitting the light in a short wavelength range of blue light of the visible spectrum.

Conventionally, the gallium nitride single crystal can be grown on a dissimilar substrate using the MBE (Molecular Beam Epitaxy) process or a vapor phase growing process, such as the MOCVD (Metal Organic Chemical Vapor Deposition) process, the HVPE (Hydride Vapor Phase Epitaxy) process, etc. As the dissimilar substrate to be used in these processes, a sapphire ($\alpha$-$Al_2O_3$) substrate or a SiC substrate is prepared. In particular, due to its hexagonal lattice structure, the same as that of gallium nitride, its lower price compared with the SiC substrate, and its high temperature stability, the sapphire substrate is generally used.

However, due to a difference of about 13% in lattice parameters and a high difference of −34% in thermal expansion coefficients between the sapphire substrate and the gallium nitride, there is a problem that strains can be created at the interface between the sapphire substrate and the GaN single crystal, generating lattice defects and cracks in the crystal. Such lattice defects and cracks make a growth of a high quality gallium nitride-based single crystal difficult, and a device made of the single crystal with such lattice defects has a short life span.

In order to solve these problems, a freestanding gallium nitride-based single crystal substrate is required. In a conventional method, the freestanding gallium nitride-based single crystal substrate is provided by course of primarily growing GaN single crystal bulk on the sapphire substrate and removing the sapphire substrate from the GaN-based single crystal bulk. Here, as methods for removing the sapphire substrate, a mechanical process using diamond powder, a chemical etching process, etc. can be applied.

In case of the mechanical process, since stresses applied to the sapphire substrate in the grown state of the GaN-based single crystal bulk are within the elastic limit thereof, the stresses bend the substrate without generating the cracks. As the mechanical process progresses, however, the sapphire substrate becomes thin so that balances between the forces are lost, creating the cracks on the sapphire substrate, which will propagate to the gallium nitride film, also resulting in the cracks on the gallium nitride film.

Additionally, in case of the chemical etching process, it is not easy to prepare etchant which can selectively etch only the sapphire substrate with a high etching rate.

Recently, there has been used a laser lift-off process, by which after being decomposed into metallic Ga and nitrogen ($\frac{1}{2} N_2$) at the interface with the sapphire substrate by irradiating the laser, the GaN-based single crystal bulk is melted and separated from the sapphire substrate at a high temperature. Although this process can be applied without creating the cracks on the substrate having a small size, there is a problem that the cracks are still created when the process is applied to a wafer of 2 inches (2") or more in diameter necessary for a process of manufacturing the semiconductor. That is, as shown in FIG. 1, when irradiating the sapphire substrate 11 for growth with the laser beam, it is conducted in such a manner that a local irradiation is repeated on the sapphire substrate 11, several times, due to narrow irradiation areas of the laser beam (to the extent of 10 mm×10 mm at most, until now), whereby stresses due to the lattice and thermal coefficient mismatch can become more serious.

By this, the cracks occur in the grown GaN-based single crystal bulk 15 and propagate along cleavage planes resulting in fracture of the GaN singly crystal bulk 15.

Thus, there is a need in the art to provide a new method of manufacturing a high quality GaN-based single crystal substrate by thoroughly solving the problem of the stresses caused by the differences in lattice parameters and in crystal structure between the GaN-based single crystal bulk and the prior substrate for growth, such as the sapphire substrate.

SUMMARY OF THE INVENTION

The present invention has been made to solve the above problems, and it is an object of the present invention to provide a method of manufacturing a gallium nitride-based single crystal substrate, which uses a ZnO substrate having a low lattice parameter difference with the gallium nitride-based single crystal and a crystal structure identical to that of the gallium nitride-based single crystal, and which employs a crystal growth method having two steps combining a process for growing the crystal and a process for removing the ZnO substrate, thereby minimizing problems caused by stresses.

In accordance with an aspect of the present invention, the above and other objects can be accomplished by the provision of a method of manufacturing a gallium nitride-based single crystal substrate comprising the steps of: a) preparing a zinc oxide (ZnO) substrate; b) primarily growing a gallium nitride-based ($Al_x In_y Ga_{(1-x-y)} N$, where $0 \leq x \leq 1$, $0 \leq y \leq 1$, $0 \leq x+y \leq 1$) single crystal layer on the ZnO substrate; and c) secondarily growing an additional gallium nitride-based single crystal layer on the primarily grown gallium nitride-based single crystal layer, while removing the ZnO substrate by etching the underside of the ZnO substrate.

The gallium nitride-based single crystal layer may be grown using an HVPE process.

The step c) may be executed at a temperature higher than that of the step b). Specifically, the temperature of the step b) may be in a range of about 500° C.~600° C., and the temperature of the step c) may be in a range of about 900° C.~1,150° C.

The primarily grown gallium nitride-based single crystal may have a thickness of about 50 μm~150 μm. Further, the ZnO substrate may have a thickness of about 150 μm or less.

The step c) may comprise the step of secondarily growing an additional gallium nitride-based single crystal layer on the primarily grown gallium nitride-based single crystal layer, while chemically etching the underside of the ZnO substrate using HCl gas.

The step b) and/or the step c) may comprise the step of growing the n-type gallium nitride-based single crystal layer with additionally supplying $SiH_4$ gas.

The method of the present invention may further comprise the step of lapping the underside of the gallium nitride-based single crystal, from which the ZnO substrate is removed, to remove the underside by a predetermined thickness, after the step c). The underside of the gallium nitride-based single crystal may be removed by a thickness approximately the same as the thickness of the primarily grown gallium nitride single crystal layer.

The method may further comprise the step polishing the lapped underside of the gallium nitride-based single crystal layer.

The present invention has essential characteristics in that generation of stress is thoroughly reduced by using a ZnO substrate having a lower lattice parameter difference with the gallium nitride-based crystal in comparison with a sapphire substrate and having a wurzite structure which is the same as that of the gallium nitride-based crystal layer, and in that an excellent gallium nitride single crystal layer is produced, to which little stress is applied by regrowing the gallium nitride-based single crystal to a predetermined thickness while removing the ZnO substrate from the underside of the ZnO substrate.

In order to achieve these characteristics, the present invention employs a primary growth process of growing the gallium nitride-based single crystal layer having a thickness smaller than that of a desired single crystal layer on the ZnO substrate, and a secondary growth process of regrowing the gallium nitride-based single crystal layer to have a desired thickness of the single crystal layer, while removing the ZnO substrate by etching the underside thereof. In this case, the gallium nitride-based single crystal may act as a buffer layer with a good quality for the gallium nitride-based single crystal layer to be secondarily grown.

BRIEF DESCRIPTION OF THE DRAWINGS

The foregoing and other objects and features of the present invention will be more clearly understood from the following detailed description taken in conjunction with the accompanying drawings, in which.

DESCRIPTION OF THE PREFERRED EMBODIMENTS

Preferred embodiments will now be described in detail with reference to the accompanying drawings.

Figure 1:
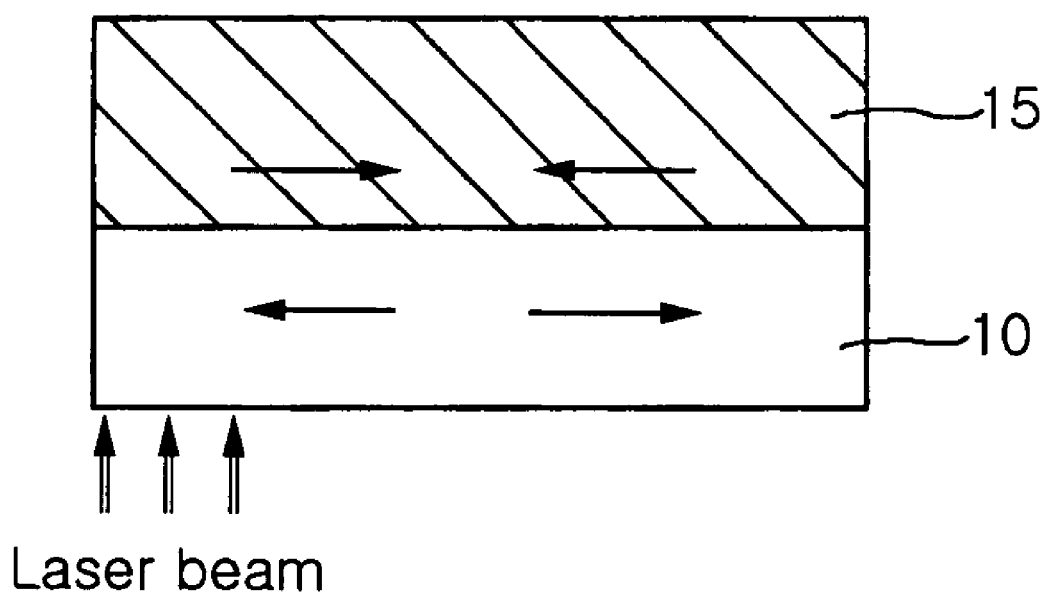
FIG. 1 is a sectional view showing a process of separating a sapphire substrate and a GaN single crystal bulk with a laser beam according to a conventional method.
Figure 2:
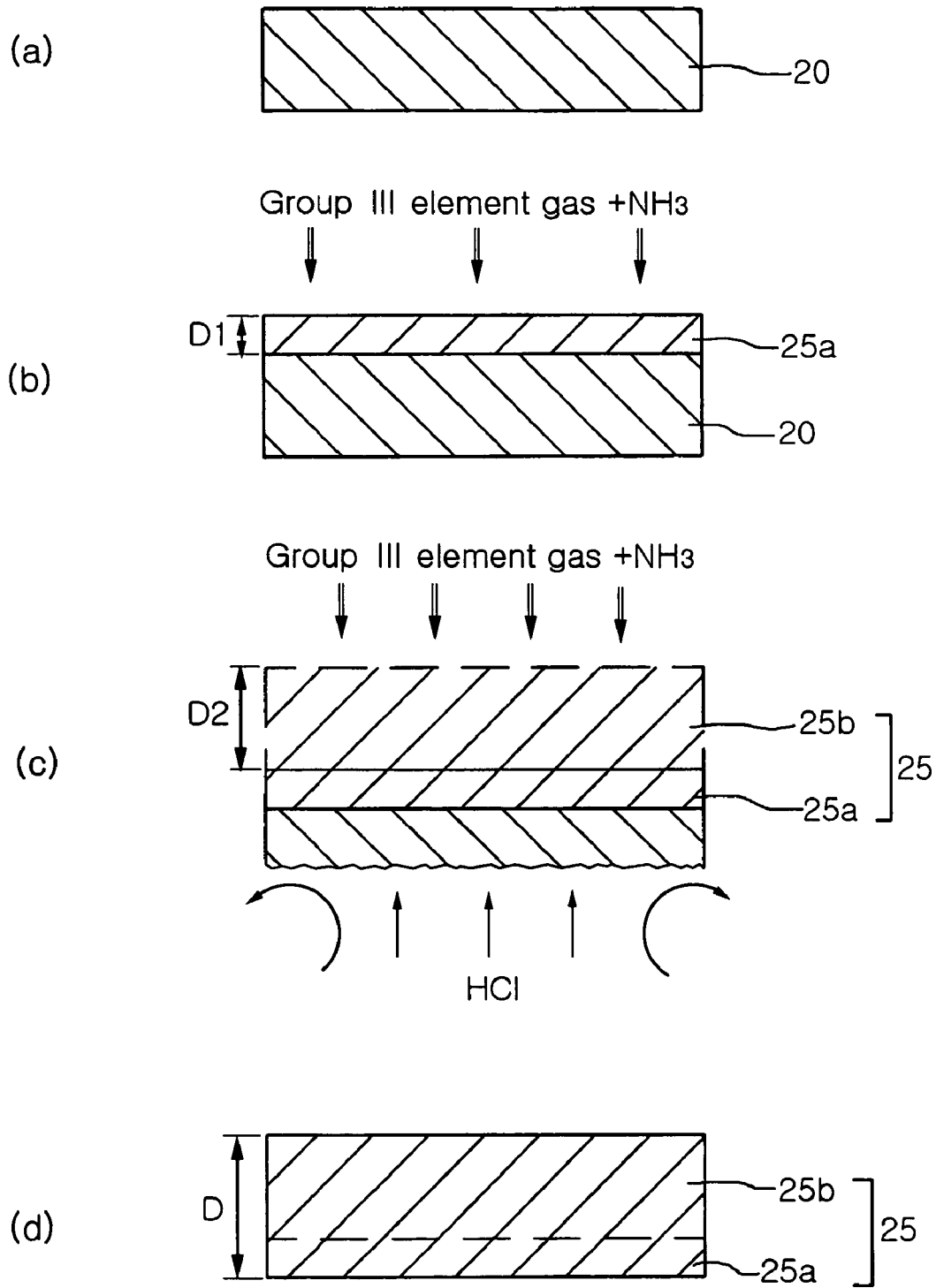
FIGS. 2a to 2d are sectional views of a flow diagram illustrating a method of manufacturing a gallium nitride-based single crystal substrate according to an embodiment of the present invention.

FIGS. 2a and 2d are sectional views of a flow diagram illustrating a method of manufacturing a gallium nitride-based single crystal substrate according to the present invention.

As shown in FIG. 2a, the method of manufacturing the gallium nitride-based single crystal substrate of the invention starts from the step of preparing a zinc oxide (ZnO) substrate 20 having a predetermined thickness. The ZnO substrate 20 of the present invention has differences of just 2% in lattice parameters to the gallium nitride-based single crystal and a wurzite structure that is the same as that of the gallium nitride-based crystal layer. Thus, in comparison with a conventional sapphire substrate, the ZnO substrate is more adequate for growing an excellent gallium nitride-based single crystal.

According to the present invention, it is desirable that the ZnO substrate 20 is as thin as possible within a range capable of growing the crystal. As a larger thickness of the ZnO substrate 20 causes a lager stress to the gallium nitride single crystal layer to be grown in subsequent processes, the thickness thereof should be minimized. Thus, the ZnO substrate 20 preferably has a thickness of about 150 μm or less.

Subsequently, as shown in FIG. 2b, the gallium nitride-based ($Al_xIn_yGa_{(1-x-y)}N$, where $0 \leq x \leq 1$, $0 \leq y \leq 1$, $0 \leq x+y \leq 1$) single crystal layer 25a is primarily grown on the ZnO substrate 20. The gallium nitride-based single crystal layer 25a may be grown using the HVPE process. In the process, after the ZnO substrate is placed in a reactor, nitrogen source gas, such as ammonia ($NH_3$), and gallium source gas, such as gallium chloride ($GaCl_x$, x=1~3), can be supplied into the reactor at a temperature of 500° C. or more to grow a GaN crystal. Additionally, an AlGaInN crystal which is a kind of GaN-based crystal can also be grown by supplying other source gas, including other group m elements, that is, indium chloride and/or aluminum chloride. Preferably, the temperature of the primary growth step is in the range of about 500° C.~600° C.

Here, the growing gallium nitride-based single crystal layer 25a is grown to a small thickness D1 so as to minimize stresses as much as possible and the thickness D1 is preferably in a range of about 50 μm~150 μm, considering the thickness of the ZnO substrate 20.

At the next step, as shown in FIG. 2c, a desired gallium nitride-based single crystal bulk 25 is prepared by secondarily growing an additional gallium nitride-based single crystal layer 25b on the primarily grown gallium nitride-based single crystal layer 25a, while removing the ZnO substrate by etching the underside of the ZnO substrate. In this step, with the thickness of the ZnO substrate reduced from the underside thereof by the etching, the additional gallium nitride-based single crystal layer is grown, so that generation of stresses caused by a thickness of the gallium nitride-based single crystal layer increasing under the secondary growth process can be minimized, and that bending or exfoliation caused by the stresses can be avoided. Further, in this step, $SiH_4$ can be additionally supplied, so that an n-type gallium nitride-based semiconductor crystal doped with Si can be grown. The manner of growing the n-type gallium nitride-based semiconductor crystal with the additional supply of $SiH_4$ can also be applied to the process as described in FIG. 2b.

In this step, the process of etching the ZnO substrate 20 is preferably carried out with supply of hydrogen chloride (HCl) gas to the underside of the ZnO substrate 20. Concurrently, the secondary growth process is carried out under the same condition with a current of the source gas and the ammonia gas as that of the primary growth process, but preferably at a higher temperature than in the primary growth process. The temperature in the secondary growth is preferably in a range of about 900° C.~1,150° C. Since the gallium nitride-based single crystal layer 25b additionally grown in the secondary growth process is grown during the removal of the ZnO substrate 20, it can be grown to a thickness D2 sufficient to provide the gallium nitride-based bulk having a predetermined thickness without danger of bending or exfoliation caused by the generation of stresses. Here, the grown gallium nitride-based single crystal layer 25b may have a thickness D2 of about 50 μm or more.

With the secondary growth process concurrently carried out with such a ZnO substrate removal process, the gallium nitride-based single crystal bulk 25 with a desired thickness D can be obtained, as shown in FIG. 2d. The gallium nitride-based single crystal bulk 25 as shown in FIG. 2d can be directly utilized as a substrate for manufacturing the LED, while a portion with a predetermined thickness may be removed by additionally executing a process of lapping the underside of the gallium nitride-based single crystal bulk 25 from which the ZnO substrate 20 is removed. This is because a portion of the gallium nitride-based single crystal in contact with the ZnO substrate 20 can have a relatively low crystalline property and because the surface thereof can be damaged in the course of removing the ZnO substrate 20. Here, the thickness of the portion to be removed may be almost the same as that of the primarily grown gallium nitride-based single crystal layer 25a. As such, the primarily grown gallium nitride-based single crystal layer 25a can constitute one substrate along with the secondarily grown layer 25b, while it can be removed by the lapping process as described above after being used for the secondary growth process to achieve a final gallium nitride-based single crystal layer 25b as a buffer layer for a higher quality gallium nitride-based single crystal layer.

After completion of the lapping process, as needed, the underside of the gallium nitride-based single crystal bulk 25 can be polished, thereby forming a smooth plane.

Figure 3:
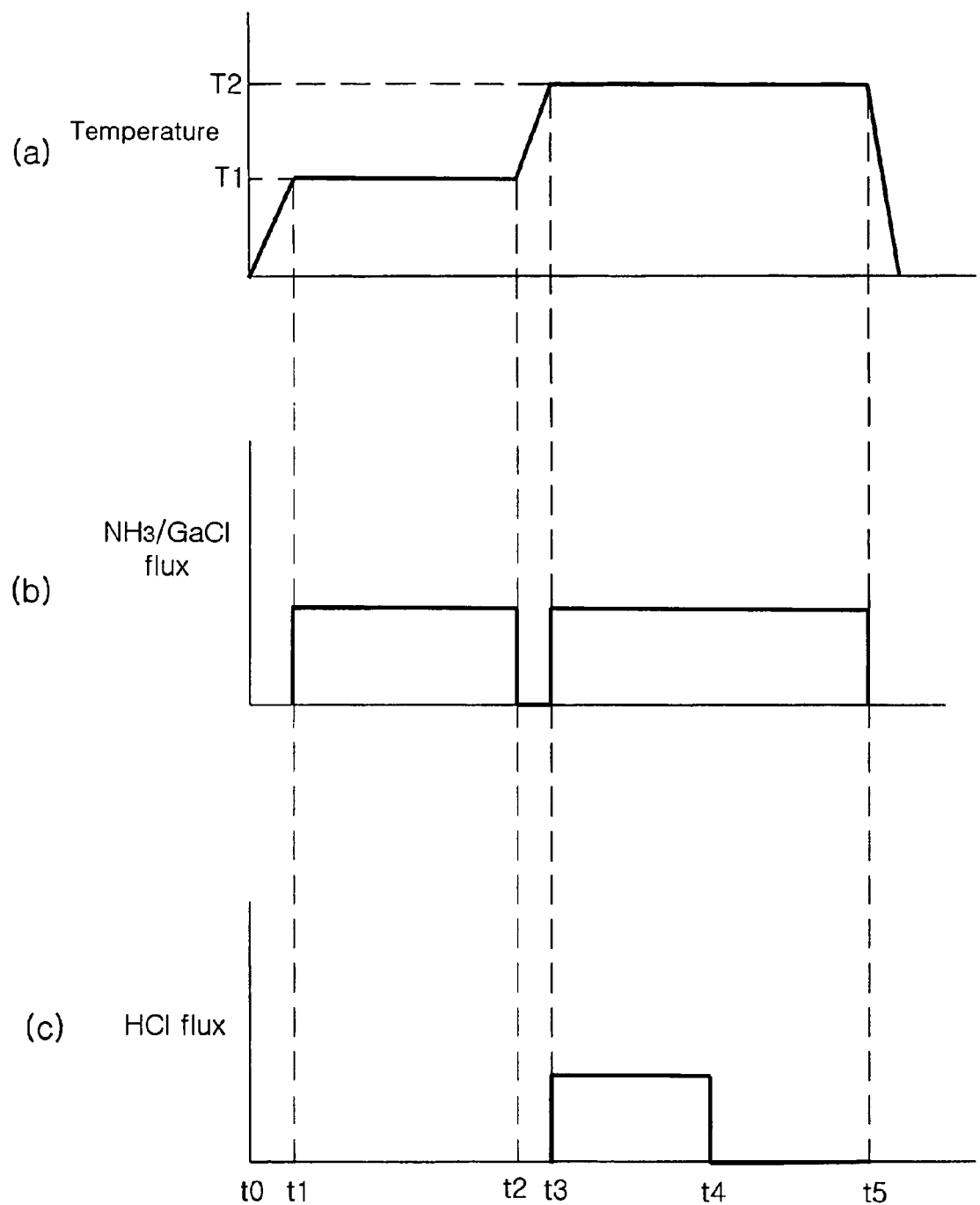
FIGS. 3a and 3c are graphs plotting conditions in a reactor to be applied to the method of manufacturing the gallium nitride-based single crystal substrate of the present invention.

FIGS. 3a and 3b are graphs plotting conditions in the reactor to be applied to the method of manufacturing the gallium nitride-based single crystal substrate of the present invention, and illustrating variations in current of the respective gas and in temperature in the reactor for the same processing time.

As shown in FIGS. 3a to 3b, after the ZnO substrate is placed in the reactor to, a primary growth temperature $T_1$ is raised. The primary growth temperature $T_1$ may be in a range of about 500° C.~600° C. As the primary growth temperature $T_1$ is reached, the gallium nitride single crystal layer is formed by supply of the ammonia gas and gallium chloride gas for a predetermined period of time $t_1$-$t_2$. After completion of the primary growth $t_2$, the temperature in the reactor is raised to a secondary growth temperature $T_2$ in order to carry out the secondary growth process. The secondary growth temperature $T_2$ may be in a range of about 900° C.~1,150° C. As the secondary growth temperature $T_2$ is reached $t_3$, the additional single crystal layer is formed on the primarily grown gallium nitride single crystal layer for a sufficient period of time $t_3$-$t_5$ by supplying the ammonia gas and the gallium chloride gas to react under the same conditions of the primary growth.

Along with the secondary growth process, as shown in FIG. 3c, the supply of hydrogen chloride gas HCl is executed from the time $t_3$ when the secondary growth process begins to the time $t_4$ when the ZnO substrate is removed. As such, the thickness of the single crystal layer formed in the secondary growth process is provided during the removal of the thickness of the ZnO substrate, so that there is little increase in the stresses caused by an increase of thickness. Further, even after the removal of the ZnO substrate, a single crystal can be formed on the same material, so that the gallium nitride single crystal with a sufficient thickness can be formed.

As apparent from the above description, according to the present invention, the problems caused by the stresses, such as the bending and the exfoliation, can be minimized by using the ZnO substrate having a lower difference in the lattice parameters from those of the gallium nitride-based crystal layer and having an identical structure to that of the gallium nitride-based crystal layer, while employing a crystal growth method having two steps combining the process of growing the crystal and the process of removing the ZnO substrate. Thus, according to the method of the present invention, the gallium nitride single crystal substrate with a lager size of 2 inches (2") or more can be prepared without generating the cracks.

It should be understood that the embodiments and the accompanying drawings as described above have been described for illustrative purposes and the present invention is limited by the following claims. Further, those skilled in the art will appreciate that various modifications, additions and substitutions are allowed without departing from the scope and spirit of the invention as set forth in the accompanying claims.

What is claimed is:

1. A method of manufacturing a gallium nitride-based single crystal substrate, comprising:
   a) preparing a zinc oxide (ZnO) substrate;
   b) primarily growing a gallium nitride-based ($Al_xIn_yGa_{(1-x-y)}N$, where $0 \leq x \leq 1$, $0 \leq y \leq 1$, $0 \leq x+y \leq 1$) single crystal layer on the ZnO substrate at a temperature of about 500° C. to 600° C.; and
   c) secondarily growing an additional gallium nitride-based single crystal layer on the primarily grown gallium nitride-based single crystal layer at a temperature of 900° C.~1,150° C., while removing the ZnO substrate by etching the underside of the ZnO substrate,
   wherein the ZnO substrate has a thickness of about 150 μm or less and the primarily grown gallium nitride-based single crystal has a thickness of about 50 μm~150 μm.

2. The method as set forth in claim 1, wherein the gallium nitride-based single crystal layer is grown using an HVPE (Hydride Vapor Phase Epitaxy) process.

3. The method as set forth in claim 1, wherein the step c) comprises the step of secondarily growing an additional gallium nitride-based single crystal layer on the primarily grown gallium nitride-based single crystal layer while chemically etching the underside of the ZnO substrate using HCl gas.

4. The method as set forth in claim 1, wherein the step b) and/or the step c) comprises the step of growing an n-type gallium nitride-based single crystal layer with additionally supplying $SiH_4$ gas.

5. The method as set forth in claim 3, further comprising: d) lapping the underside of the gallium nitride-based single crystal, from which the ZnO substrate is removed, thereby removing the underside by a predetermined thickness, after the step c).

6. The method as set forth in claim 5, wherein the underside of the gallium nitride-based single crystal is removed by a thickness approximately the same as the thickness of the primarily grown gallium nitride single crystal layer.

7. The method as set forth in claim 5, further comprising: e) polishing the lapped underside of the gallium nitride-based single crystal.

8. A method of manufacturing a gallium nitride-based single crystal substrate, comprising:
   a) preparing a zinc oxide (ZnO) substrate;
   b) primarily growing a gallium nitride-based ($Al_xIn_yGa_{(1-x-y)}N$, where $0 \leq x \leq 1$, $0 \leq y \leq 1$, $0 \leq x+y \leq 1$) single crystal layer on the ZnO substrate at a temperature of about 500 C to 600° C.; and
   c) secondarily growing an additional gallium nitride-based single crystal layer on the primarily grown gallium nitride-based single crystal layer at a temperature of 900° C.~1,150° C., while removing the ZnO substrate by etching the underside of the ZnO substrate.

* * * * *